(12) United States Patent
Liu

(10) Patent No.: US 12,150,249 B2
(45) Date of Patent: *Nov. 19, 2024

(54) METHOD FOR FORMING A PROTECTIVE FILM ON AN ELECTRONIC MODULE

(71) Applicant: ELEADTK CO., LTD., Hsinchu County (TW)

(72) Inventor: Shao-Chi Liu, Hsinchu County (TW)

(73) Assignee: ELEADTK CO., LTD., Hsinchu County (TW)

( * ) Notice: Subject to any disclaimer, the term of this patent is extended or adjusted under 35 U.S.C. 154(b) by 225 days.

This patent is subject to a terminal disclaimer.

(21) Appl. No.: 17/968,816

(22) Filed: Oct. 19, 2022

(65) Prior Publication Data

US 2024/0098904 A1    Mar. 21, 2024

(30) Foreign Application Priority Data

Sep. 19, 2022 (TW) .................................. 111135413

(51) Int. Cl.
*B29C 51/10* (2006.01)
*B29C 51/12* (2006.01)
(Continued)

(52) U.S. Cl.
CPC ............. *H05K 3/284* (2013.01); *B29C 51/10* (2013.01); *B29C 51/12* (2013.01); *B29L 2031/3406* (2013.01); *H05K 2203/1476* (2013.01)

(58) Field of Classification Search
None
See application file for complete search history.

(56) References Cited

U.S. PATENT DOCUMENTS

| 6,613,608 B1 * | 9/2003 | Yamaguchi ......... B32B 37/0015 438/126 |
| 6,933,179 B1 | 8/2005 | Tanaka |
| 2019/0343004 A1 | 11/2019 | Chang et al. |

FOREIGN PATENT DOCUMENTS

| CN | 107969073 | 4/2018 |
| EP | 0904923 | 3/1999 |

(Continued)

OTHER PUBLICATIONS

"Office Action of Taiwan Counterpart Application", issued on Jul. 10, 2023, p. 1-p. 9.

(Continued)

*Primary Examiner* — Alison L Hindenlang
*Assistant Examiner* — Debjani Roy
(74) *Attorney, Agent, or Firm* — JCIP GLOBAL INC.

(57) ABSTRACT

A method for forming a protective film on an electronic module includes: placing the electronic module and a protective material placed on the electronic module in a chamber; performing a first heating procedure on the protective material in the chamber, and performing a first pressure boosting procedure, wherein a pressure in the first pressure boosting procedure is greater than 1 atmosphere; after softening the protective material, maintaining the first heating procedure, and performing an oscillating decompression procedure on the chamber, wherein the oscillating decompression procedure includes alternately changing pressures in the chamber between multiple low pressures less than 1 atmosphere; maintaining the first heating procedure, and performing a second pressure boosting procedure on the chamber, wherein a pressure in the second boosting procedure is less than that of the first boosting procedure and greater than 1 atmosphere; and performing a second heating (Continued)

procedure on the protective material in the chamber to form the protective film covering the electronic module.

11 Claims, 7 Drawing Sheets

(51) Int. Cl.
*H05K 3/28* (2006.01)
*B29L 31/34* (2006.01)

(56) References Cited

FOREIGN PATENT DOCUMENTS

| | | |
|---|---|---|
| JP | 2001332654 | 11/2001 |
| JP | 2009278058 | 11/2009 |
| JP | 2011124413 | 6/2011 |
| TW | 201948011 | 12/2019 |
| TW | I689237 | 3/2020 |

OTHER PUBLICATIONS

"Office Action of Germany Counterpart Application", issued on May 5, 2023, p. 1-p. 6.
"Notice of allowance of Japan Counterpart Application", issued on Mar. 26, 2024, p. 1-p. 2.

* cited by examiner

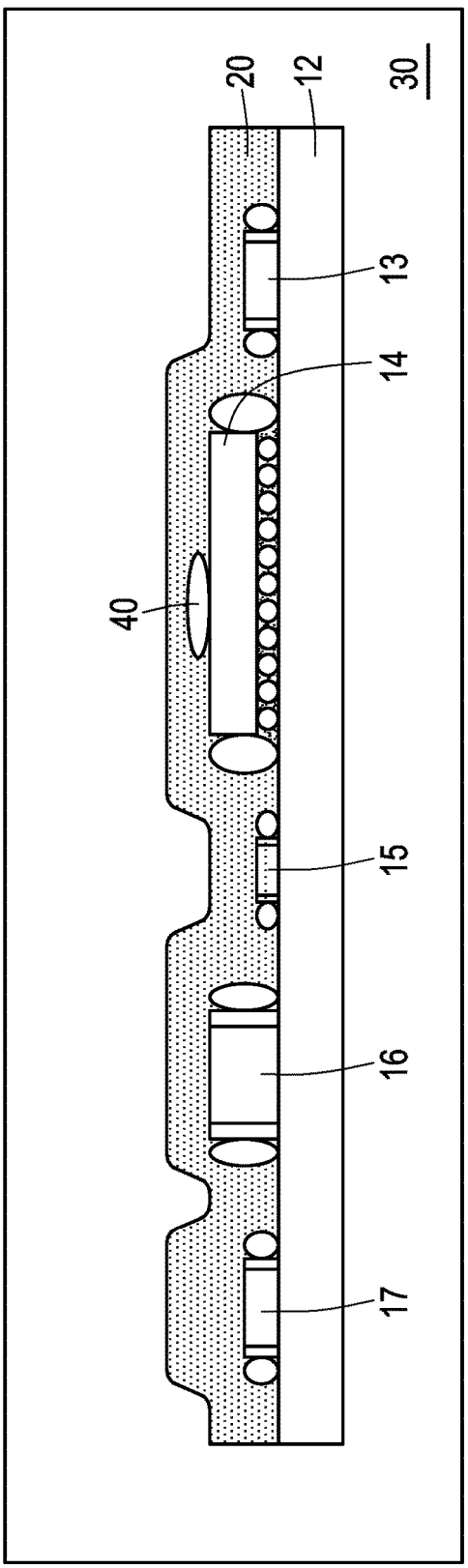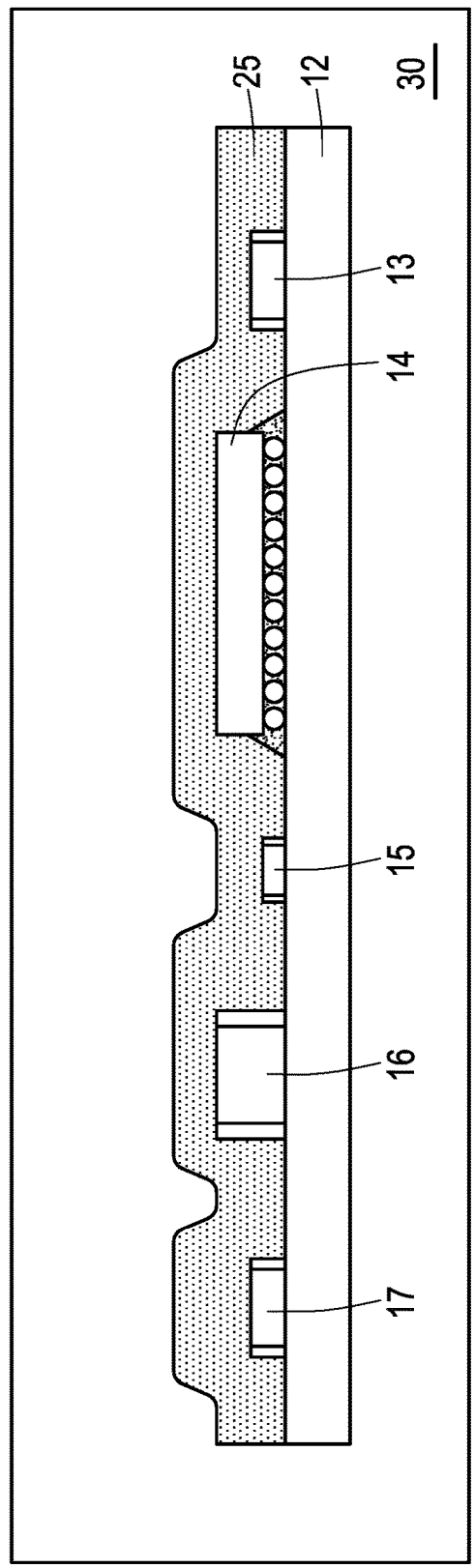
FIG. 2B
FIG. 2C

METHOD FOR FORMING A PROTECTIVE FILM ON AN ELECTRONIC MODULE

CROSS-REFERENCE TO RELATED APPLICATION

This application claims the priority benefit of Taiwan application serial no. 111135413, filed on Sep. 19, 2022. The entirety of the above-mentioned patent application is hereby incorporated by reference herein and made a part of this specification.

BACKGROUND

Technical Field

The disclosure relates to a method for forming a protective film, and more particularly, to a method for forming a protective film on an electronic module.

Description of Related Art

Generally, there are electronic elements of different sizes on a motherboard used for an electronic device. A conventional method is to stick a protective glue on the motherboard in mechanical or manual manners to protect the motherboard and the electronic elements on the motherboard. However, the foregoing method often causes residual air bubbles between the protective glue and the motherboard or between the protective glue and the electronic elements because the protective glue is difficult to adhere tightly. Therefore, it often leads to coating of water vapor, thereby reducing the working life of the electronic elements or having issues of reliability.

SUMMARY

The disclosure provides a method for forming a protective film on an electronic module, which may effectively reduce the probability of residual air bubbles between a protective glue and an electronic element.

A method for forming a protective film on an electronic module in the disclosure includes the following. The electronic module and a protective material placed on the electronic module are placed in a chamber. The protective material and the electronic module are in contact with each other. A first heating procedure is performed on the protective material in the chamber to soften the protective material placed on the electronic module, and a first pressure boosting procedure is performed on the chamber. A pressure in the first pressure boosting procedure is greater than 1 atmosphere. After the protective material is softened, the first heating procedure is maintained, and an oscillating decompression procedure is performed on the chamber. The oscillating decompression procedure includes alternately changing pressures in the chamber between multiple low pressures less than 1 atmosphere. The first heating procedure is maintained, and a second pressure boosting procedure is performed on the chamber. A pressure in the second pressure boosting procedure is less than the pressure in the first pressure boosting procedure and greater than 1 atmosphere. A second heating procedure is performed on the protective material in the chamber to cure the protective material covering the electronic module to form the protective film covering the electronic module.

In an embodiment of the disclosure, in the oscillating decompression procedure, the low pressures include a basic low pressure and multiple variable low pressures. A pressure of the basic low pressure is greater than pressures of the variable low pressures. The variable low pressures gradually decrease over time. The variable low pressures alternate with the basic low pressure, so that two of the variable low pressures in two adjacent time sequences return to the basic low pressure first.

In an embodiment of the disclosure, a time that the chamber remains at each of the variable low pressures is longer than a time that the chamber remains at the basic low pressure.

In an embodiment of the disclosure, after the first pressure boosting procedure and the oscillating decompression procedure are performed, and before the second pressure boosting procedure is performed, the method further includes the following. The first pressure boosting procedure and the oscillating decompression procedure are repeatedly performed on the chamber.

In an embodiment of the disclosure, a pressure difference of the low pressures in the oscillating decompression procedure for the second time is greater than the pressure difference of the low pressures in the oscillating decompression procedure for the first time.

In an embodiment of the disclosure, after the first pressure boosting procedure and the oscillating decompression procedure are repeatedly performed on the chamber, and before the second pressure boosting procedure is performed, the method further includes the following.

The first pressure boosting procedure and a decompression procedure are performed on the chamber. A pressure in the decompression procedure is less than a pressure in the oscillating decompression procedure.

In an embodiment of the disclosure, a time that the chamber remains at the pressure in the decompression procedure is longer than a time that the chamber remains at the pressure in the oscillating decompression procedure.

In an embodiment of the disclosure, the pressure in the first pressure boosting procedure for the first time is the same as or different from the pressure in the first pressure boosting procedure for the second time.

In an embodiment of the disclosure, when the second heating procedure is performed, a third pressure boosting procedure is performed on the chamber at the same time.

In an embodiment of the disclosure, the electronic module includes multiple electronic elements, and an outline of a surface of the protective film covering the electronic module is conformal to outlines of the electronic elements.

In an embodiment of the disclosure, the electronic module includes multiple electronic elements, and a surface of the protective film covering the electronic module is flat and not conformal to outlines of the electronic elements.

Based on the above, in the method for forming the protective film on the electronic module, the first heating procedure is performed on the protective materials in the chamber to soften the protective materials placed on the electronic module, and the first pressure boosting procedure is performed on the chamber, so that the air bubbles between the electronic module and the protective materials move upward to the positions close to the surfaces of the protective materials. Next, the first heating procedure is maintained, and the oscillating decompression procedure is performed on the chamber. The oscillating decompression procedure includes alternately changing the pressures in the chamber between the low pressures less than 1 atmosphere. In the oscillating decompression procedure, the air bubbles in the protective materials and close to the surfaces will burst due to the change in the size back and forth with the change in the pressure in the chamber. Then, the first heating procedure is maintained, and the second pressure boosting procedure is performed on the chamber. The pressure in the second pressure boosting procedure is less than the pressure in the first pressure boosting procedure and greater than 1 atmosphere. In the second pressure boosting procedure, the softened protective materials may be compressed and flattened. Finally, the second heating procedure is performed on the protective materials in the chamber, so as to cure the protective materials covering the electronic module to form the protective film covering the electronic module.

BRIEF DESCRIPTION OF THE DRAWINGS

FIGS. 2A to 2C are schematic views of one of flowcharts of forming the protective film on the electronic module in FIG. 1.

DETAILED DESCRIPTION OF DISCLOSED EMBODIMENTS

Figure 1:
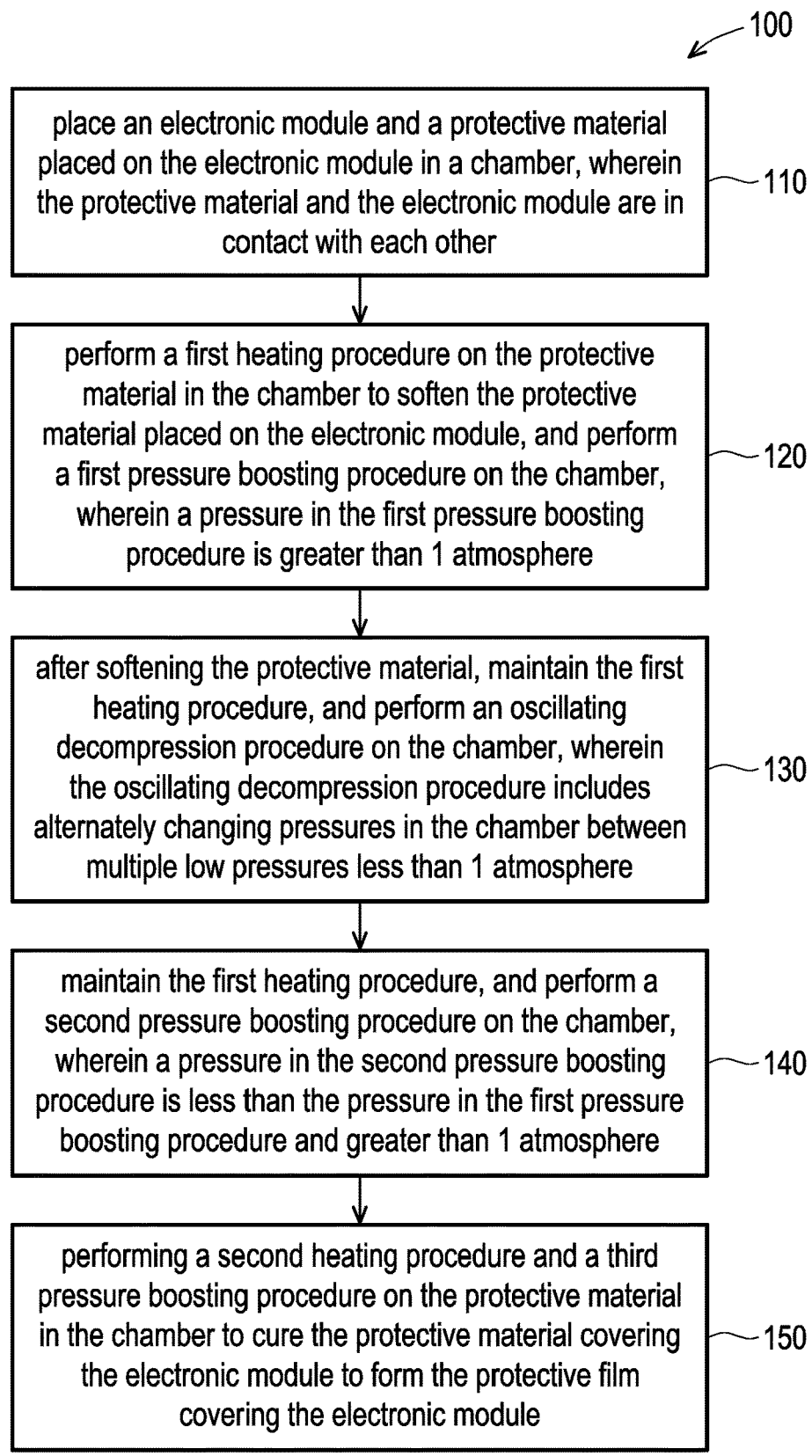
FIG. 1 is a schematic view of steps of a method for forming a protective film on an electronic module according to an embodiment of the disclosure.
Figure 2A:
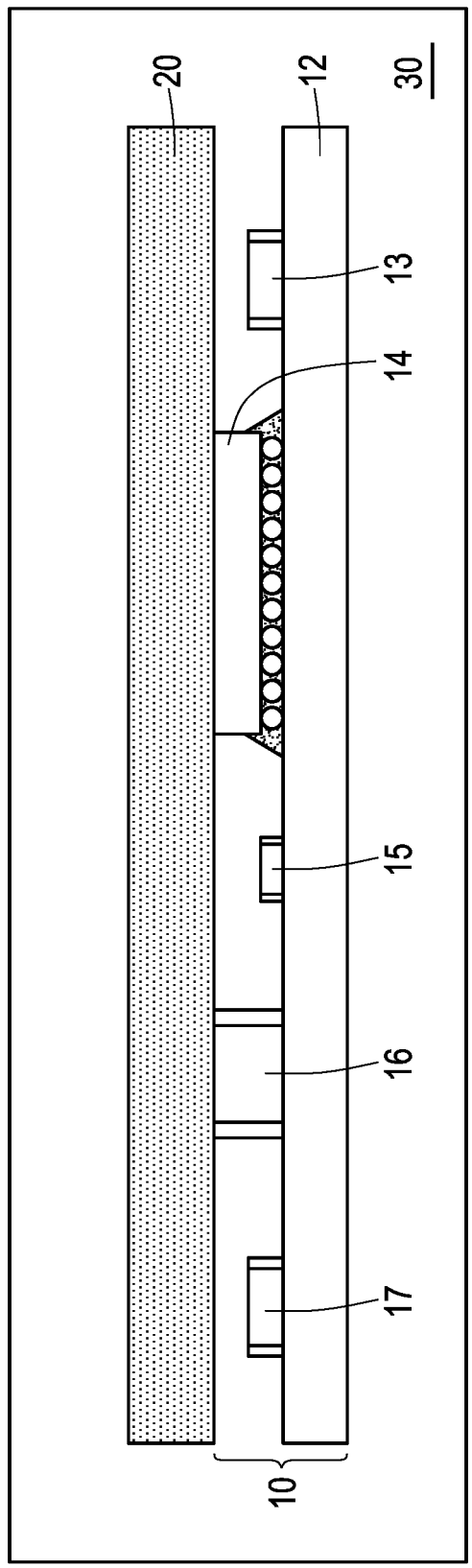
Figure 3A:
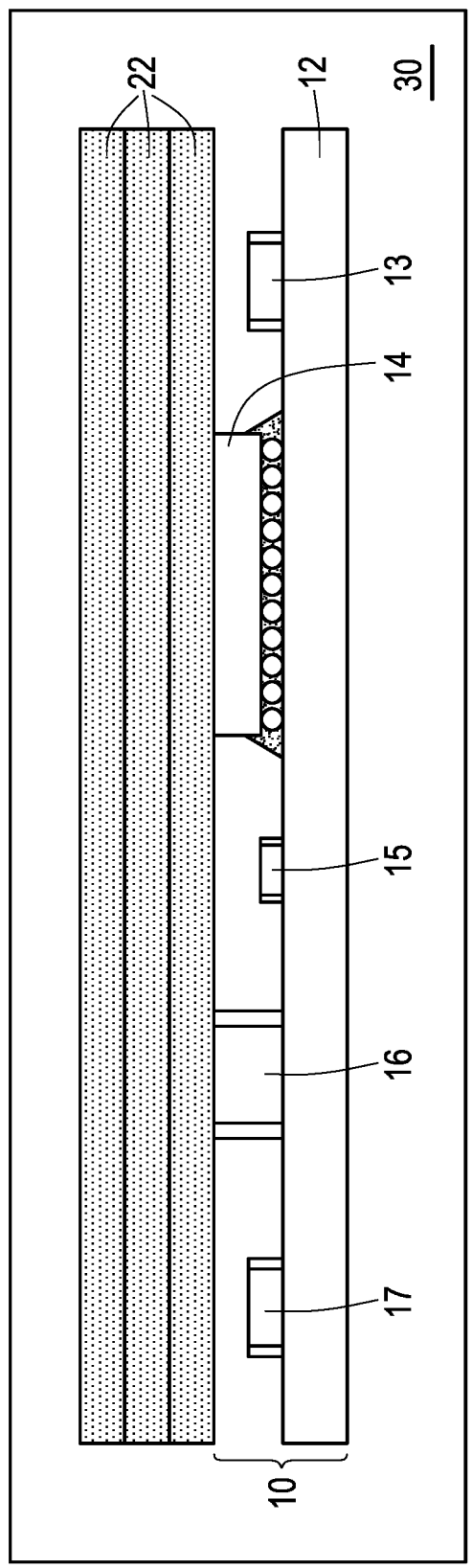
FIGS. 3A to 3C are schematic views of another one of the flowcharts of forming the protective film on the electronic module in FIG. 1.
Figure 3B:
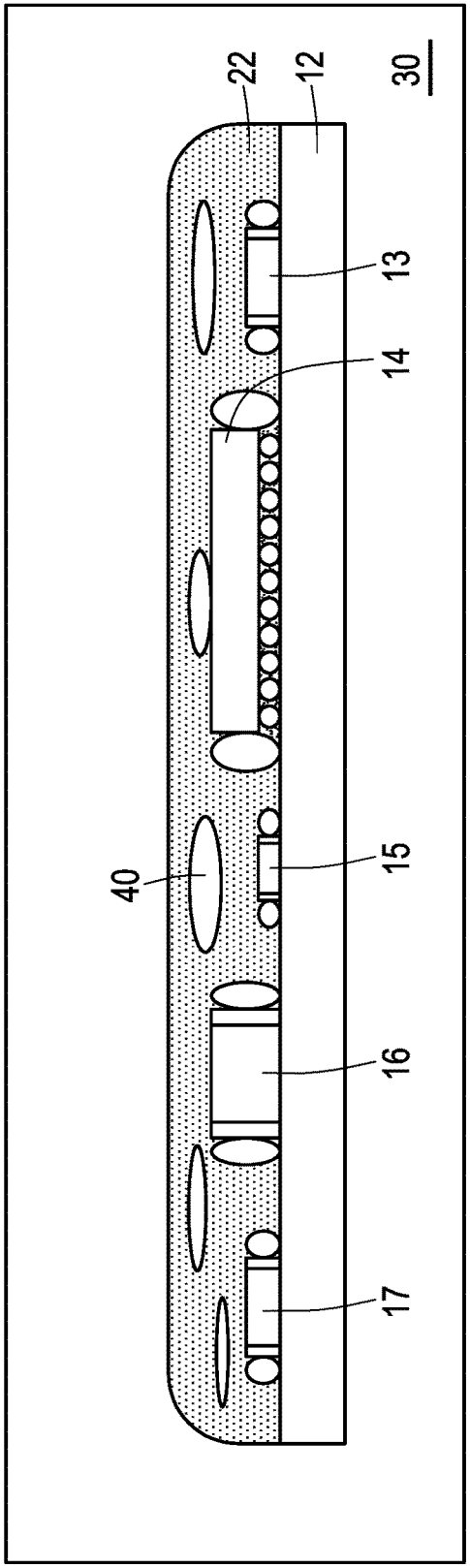
Figure 3C:
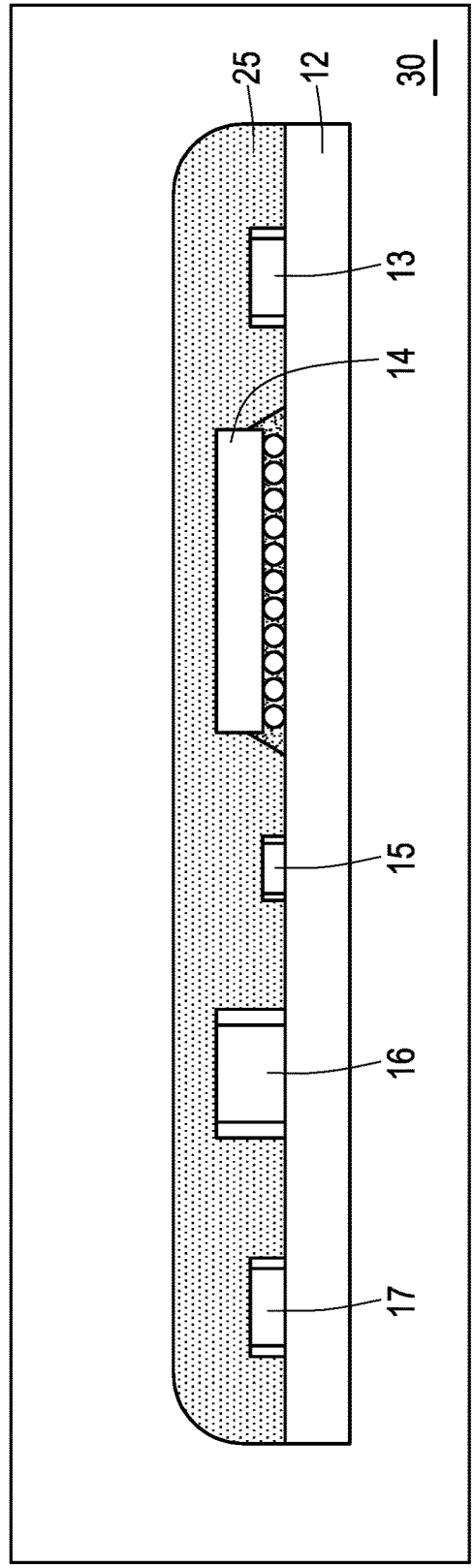
Figure 4A:
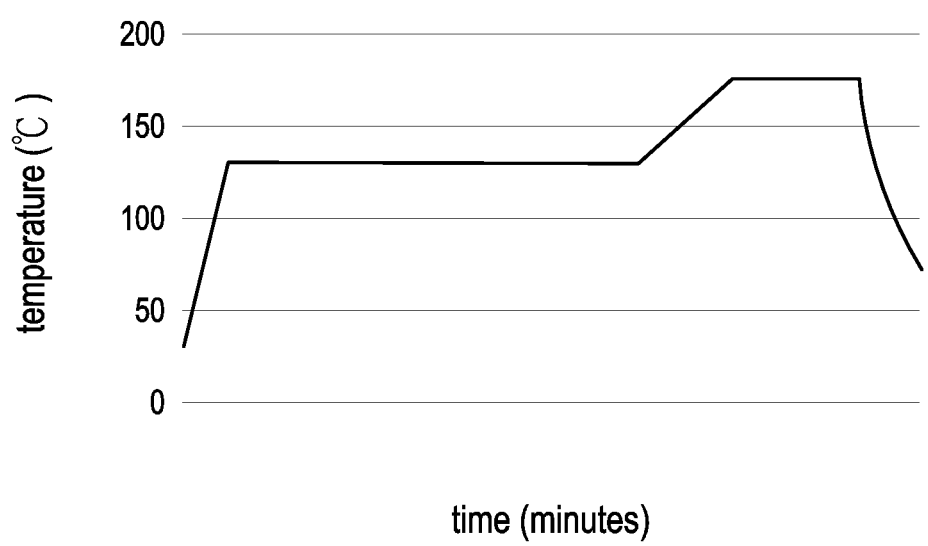
FIG. 4A is a schematic view of a relationship between time and temperatures in the method in FIG. 1.
Figure 4B:
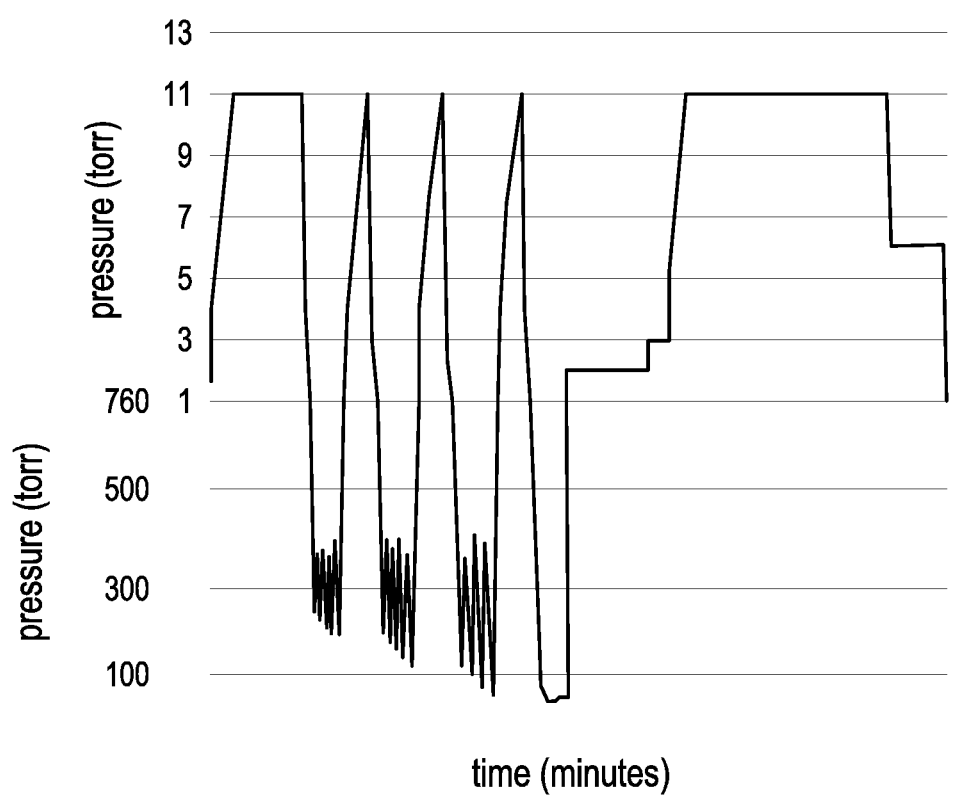
FIG. 4B is a schematic view of a relationship between time and pressures in the method in FIG. 1.

FIG. 1 is a schematic view of steps of a method for forming a protective film on an electronic module according to an embodiment of the disclosure. FIGS. 2A to 2C are schematic views of one of flowcharts of forming the protective film on the electronic module in FIG. 1. FIGS. 3A to 3C are schematic views of another one of the flowcharts of forming the protective film on the electronic module in FIG. 1. FIG. 4A is a schematic view of a relationship between time and temperatures in the method in FIG. 1. FIG. 4B is a schematic view of a relationship between time and pressures in the method in FIG. 1.

Referring to FIGS. 1, 2A, and 3A first, a method 100 for forming a protective film on an electronic module in this embodiment includes the following steps. First, in step 110, an electronic module 10 and protective materials 20 (FIG. 2A) and 22 (FIG. 3A) placed on the electronic module 10 are placed in a chamber 30. The protective materials 20 and 22 and the electronic module 10 are in contact with each other.

In FIG. 2A, the electronic module 10 includes a circuit board 12 and multiple electronic elements 13 to 17 disposed on the circuit board 12, and the electronic elements 13 to 17 have different heights. The protective material 20 is placed above the electronic elements 13 to 17, and a range of the protective material 20 does not exceed a range of the circuit board 12.

The difference between the embodiment of FIG. 3A and the embodiment of FIG. 2A is that in FIG. 3A, the protective material 22 may be multi-layered, so that the protective materials 22 have a greater thickness.

Next, in step 120, a first heating procedure is performed on the protective materials 20 and 22 in the chamber 30 to soften the protective materials 20 and 22 placed on the electronic module 10, and a first pressure boosting procedure is performed on the chamber 30. A pressure in the first pressure boosting procedure is greater than 1 atmosphere. The first heating procedure at this stage softens the protective materials 20 and 22, and the multi-layered protective materials 22 in FIG. 3B are integrated. As shown in FIGS. 2B and 3B, the softened protective materials 20 and 22 collapse to be in contact with the circuit board 12, and multiple air bubbles 40 are formed between the protective materials 20 and 22 and the electronic elements 13 to 17. The first pressure boosting procedure is configured to enable the air bubbles 40 between the electronic module 10 and the protective materials 20 and 22 to gradually move upward from positions shown in FIGS. 2B and 3B to positions close to surfaces of the protective materials 20 and 22.

In this embodiment, a temperature of the first heating procedure is, for example, 130 degrees, and the pressure is, for example, 11 atmospheres, that is, a pressure difference from an external stress is 10 atmospheres. The first pressure boosting procedure may be performed for to 25 minutes. Of course, values of the first pressure boosting procedure and the first heating procedure are not limited thereto.

Then, in step 130, after the protective materials 20 and 22 are softened, the first heating procedure is maintained, and an oscillating decompression procedure is performed on the chamber 30. The oscillating decompression procedure includes alternately changing pressures in the chamber 30 between multiple low pressures less than 1 atmosphere.

As shown in FIG. 4B, the pressure first drops less than 1 atmosphere, then under the premise of less than 1 atmosphere, an oscillation for changing the magnitude of the pressure is performed, and then the pressure is increased to a high pressure and then reduced to less than 1 atmosphere to perform the oscillation for changing the magnitude of the pressure, which is repeated several times. That is to say, in this embodiment, the first pressure boosting procedure and the oscillating decompression procedure are repeatedly performed on the chamber 30. Of course, whether it is repeated and the number of times of repetition are not limited by the drawing.

Specifically, according to FIG. 4B, in this embodiment, the oscillating decompression procedure is performed three times, and in the oscillating decompression procedure each time, the oscillation occurs between a basic low pressure and multiple variable low pressures. A pressure of the basic low pressure is greater than those of the variable low pressures, and the variable low pressures gradually decrease over time. The variable low pressures alternate with the basic low pressure, so that two of the variable low pressures in two adjacent time sequences return to the basic low pressure first.

For the first oscillation, a relationship between pressures and time is shown in Table 1. The time that chamber 30 remains at each of the variable low pressures is longer than the time that the chamber 30 remains at the basic low pressure. Specifically, in this embodiment, the basic low pressure is 380 torr and lasts for 0 seconds, and the variable low pressure gradually decreases from 270 torr to 210 torr and lasts for 30 seconds each time. In this process, the air bubbles 40 in the protective materials 20 and 22 and close to the surfaces will burst due to the change in the size back and forth with the change in the pressure in the chamber 30.

TABLE 1

| Pressure (torr) | Time (sec) |
| --- | --- |
| 270 | 30 |
| 380 | 0 |
| 250 | 30 |
| 380 | 0 |

TABLE 1-continued

| Pressure (torr) | Time (sec) |
|---|---|
| 230 | 30 |
| 380 | 0 |
| 210 | 30 |
| 380 | 0 |
| 210 | 30 |
| 750 | 0 |

Next, the first pressure boosting procedure is performed on the chamber 30 for the second time. For example, the pressure in the first pressure boosting procedure for the second time is 10 atmospheres and lasts for six minutes. In this embodiment, the pressure in the first pressure boosting procedure for the second time is the same as the pressure in the first pressure boosting procedure for the first time. However, in other embodiments, the pressure in the first pressure boosting procedure for the second time may also be different from the pressure in the first pressure boosting procedure for the first time.

Then, the oscillating decompression procedure is performed for the second time. A purpose of the oscillating decompression procedure for the second time is to allow the air bubbles 40 that have not burst under the oscillating decompression procedure for the first time to burst in this procedure. A pressure difference of the low pressures in the oscillating decompression procedure for the second time is greater than that of the low pressures in the oscillating decompression procedure for the first time. Due to material properties of the protective materials 20 and 22, viscosity of a protective glue material with the curing reaction will increase with time at the same temperature, so that it is more difficult for the air bubbles 40 to burst. Therefore, by increasing the pressure difference, a range of a volume change of the air bubbles 40 is increased, which is helpful for the air bubbles 40 to burst.

The pressures and time in the oscillating decompression procedure for the second time are shown in Table 2 below. In this embodiment, the basic low pressure is 380 torr and lasts for 0 seconds, and the variable low pressure gradually decreases from 210 torr to 130 torr and lasts for 30 seconds each time.

TABLE 2

| Pressure (torr) | Time (sec) |
|---|---|
| 210 | 30 |
| 380 | 0 |
| 190 | 30 |
| 380 | 0 |
| 170 | 30 |
| 380 | 0 |
| 150 | 30 |
| 380 | 0 |
| 130 | 30 |
| 750 | 0 |

Next, the first pressure boosting procedure is performed on the chamber 30 for the third time. For example, the pressure in the first pressure boosting procedure for the third time is 10 atmospheres and lasts for six minutes. Then, the oscillating decompression procedure for the third time is performed. The pressures and time in the oscillating decompression procedure for the third time are shown in Table 3 below. In this embodiment, the basic low pressure is 380 torr and lasts for 0 seconds, and the variable low pressure gradually decreases from 130 torr to 30 torr and lasts for 40 seconds each time.

TABLE 3

| Pressure (torr) | Time (sec) |
|---|---|
| 130 | 40 |
| 380 | 0 |
| 100 | 40 |
| 380 | 0 |
| 70 | 40 |
| 380 | 0 |
| 30 | 40 |
| 750 | 0 |

Then, the first pressure boosting procedure is performed on the chamber 30 for the fourth time. The pressure in the first pressure boosting procedure for the fourth time is 10 atmospheres and lasts for six minutes. Afterward, a decompression procedure is performed. In this embodiment, a pressure in the decompression procedure is less than a pressure in the oscillating decompression procedure, and the time that the chamber 30 remains at the pressure in the decompression procedure is longer than the time that the chamber 30 remains at the pressure in the oscillating decompression procedure. Specifically, the pressure in the decompression procedure is 30 torr, and the time is 300 seconds. In this step, the remaining air bubbles 40 may be directly expanded to burst by using the relatively small pressure (a large negative pressure value) close to a vacuum for a relatively long time.

Next, in step 140, the first heating procedure is maintained, and a second pressure boosting procedure is performed on the chamber 30. A pressure in the second pressure boosting procedure is less than the pressure in the first pressure boosting procedure and greater than 1 atmosphere. In this embodiment, the second pressure boosting procedure is, for example, to first boost the pressure to 2 atmospheres for 20 minutes and then boost the pressure to 3 atmospheres for 5 minutes. In the previous step, the surfaces of the protective materials 20 and 22 are uneven due to the burst of the air bubbles 40, so that the lower high pressure (2 to 3 atmospheres) may be used to flatten the surfaces of the protective materials 20 and 22 without being too high to inhibit the flow of the protective materials 20 and 22.

In addition, since the viscosity of the protective materials 20 and 22 at a certain temperature will gradually increase with time, the second pressure boosting procedure is divided into two steps of pressure boosting, which is more helpful to flatten the surfaces of the protective materials 20 and 22. Of course, in other embodiments, it may be done by only one step of pressure boosting. In addition, it may be done in more steps.

Next, in step 150, a second heating procedure is performed on the protective materials 20 and 22 in the chamber 30, so as to cure the protective materials 20 and 22 covering the electronic module 10 to form a protective film 25 covering the electronic module 10 as shown in FIGS. 2C and 3C. The protective materials 20 and 22 are, for example, thermosetting materials. In the second heating procedure, the temperature may be raised to 175 degrees to cure the protective materials 20 and 22. While the second heating procedure is performed, a third pressure boosting procedure is performed on the chamber 30 at the same time. The pressure at this stage may be 11 atmospheres, and the duration may be 30 minutes to 60 minutes or the minimum curing time required for the protective materials 20 and 22.

Finally, as shown in FIGS. 4A and 4B, the temperature is lowered, and the pressure is lowered. The temperature at this stage is 80 degrees; the pressure may be 6 atmospheres, and the time may be 25 minutes. However, the disclosure is not limited thereto.

In FIG. 2C, an outline of a surface of the protective film 25 covering the electronic module 10 is conformal to outlines of the electronic elements 13 to 17. In FIG. 3C, since the protective film 25 is relatively thick, the surface of the protective film 25 covering the electronic module 10 may be flat and not conformal to the outlines of the electronic elements 13 to 17. In addition, according to FIGS. 2C and 3C, the protective film 25 only covers a top surface of the circuit board 12 without flowing to a side or back of the circuit board 12.

It is worth mentioning that, if the surface of the protective film 25 in FIG. 3C is to be manufactured as a plane structure, since the protective material 22 used at the beginning has more layers or is thicker, it is difficult for the protective material 22 to remove the air bubbles 40. The method 100 for forming the protective film 25 on the electronic module 10 in this embodiment may effectively remove the air bubbles 40 through the oscillating decompression procedure, and the structure of FIG. 3C may be completed.

Based on the above, in the method for forming the protective film on the electronic module, the first heating procedure is performed on the protective materials in the chamber to soften the protective materials placed on the electronic module, and the first pressure boosting procedure is performed on the chamber, so that the air bubbles between the electronic module and the protective materials move upward to the positions close to the surfaces of the protective materials. Next, the first heating procedure is maintained, and the oscillating decompression procedure is performed on the chamber. The oscillating decompression procedure includes alternately changing the pressures in the chamber between the low pressures less than 1 atmosphere. In the oscillating decompression procedure, the air bubbles in the protective materials and close to the surfaces will burst due to the change in the size back and forth with the change in the pressure in the chamber. Then, the first heating procedure is maintained, and the second pressure boosting procedure is performed on the chamber. The pressure in the second pressure boosting procedure is less than the pressure in the first pressure boosting procedure and greater than 1 atmosphere. In the second pressure boosting procedure, the softened protective materials may be compressed and flattened. Finally, the second heating procedure is performed on the protective materials in the chamber, so as to cure the protective materials covering the electronic module to form the protective film covering the electronic module.

What is claimed is:

1. A method for forming a protective film on an electronic module, comprising:
    placing the electronic module and a protective material placed on the electronic module in a chamber, wherein the protective material and the electronic module are in contact with each other;
    performing a first heating procedure on the protective material in the chamber to soften the protective material placed on the electronic module, and performing a first pressure boosting procedure on the chamber, wherein a pressure in the first pressure boosting procedure is greater than 1 atmosphere;
    after softening the protective material, maintaining the first heating procedure, and performing an oscillating decompression procedure on the chamber, wherein the oscillating decompression procedure comprises alternately changing pressures in the chamber between a plurality of low pressures less than 1 atmosphere;
    maintaining the first heating procedure, and performing a second pressure boosting procedure on the chamber, wherein a pressure in the second pressure boosting procedure is less than the pressure in the first pressure boosting procedure and greater than 1 atmosphere; and
    performing a second heating procedure on the protective material in the chamber to cure the protective material covering the electronic module to form the protective film covering the electronic module.

2. The method for forming the protective film on the electronic module according to claim 1, wherein in the oscillating decompression procedure, the low pressures comprise a basic low pressure and a plurality of variable low pressures, a pressure of the basic low pressure is greater than pressures of the variable low pressures, the variable low pressures gradually decrease over time, and the variable low pressures alternate with the basic low pressure, so that two of the variable low pressures in two adjacent time sequences return to the basic low pressure first.

3. The method for forming the protective film on the electronic module according to claim 1, wherein after performing the first pressure boosting procedure and the oscillating decompression procedure, and before performing the second pressure boosting procedure, the method further comprises: repeatedly performing the first pressure boosting procedure and the oscillating decompression procedure on the chamber.

4. The method for forming the protective film on the electronic module according to claim 1, wherein when the second heating procedure is performed, a third pressure boosting procedure is performed on the chamber at the same time.

5. The method for forming the protective film on the electronic module according to claim 1, wherein the electronic module comprises a plurality of electronic elements, and an outline of a surface of the protective film covering the electronic module is conformal to outlines of the electronic elements.

6. The method for forming the protective film on the electronic module according to claim 1, wherein the electronic module comprises a plurality of electronic elements, and a surface of the protective film covering the electronic module is flat and not conformal to outlines of the electronic elements.

7. The method for forming the protective film on the electronic module according to claim 2, wherein a time that the chamber remains at each of the variable low pressures is longer than a time that the chamber remains at the basic low pressure.

8. The method for forming the protective film on the electronic module according to claim 3, wherein a pressure difference of the low pressures in the oscillating decompression procedure for the second time is greater than the pressure difference of the low pressures in the oscillating decompression procedure for the first time.

9. The method for forming the protective film on the electronic module according to claim 3, wherein after repeatedly performing the first pressure boosting procedure and the oscillating decompression procedure on the chamber, and before performing the second pressure boosting procedure, the method further comprises: performing the first pressure boosting procedure and a decompression procedure on the chamber, wherein a pressure in the decompression procedure is less than a pressure in the oscillating decompression procedure.

10. The method for forming the protective film on the electronic module according to claim 9, wherein a time that the chamber remains at the pressure in the decompression procedure is longer than a time that the chamber remains at the pressure in the oscillating decompression procedure.

11. The method for forming the protective film on the electronic module according to claim 3, wherein the pressure in the first pressure boosting procedure for the first time is the same as or different from the pressure in the first pressure boosting procedure for the second time.

\* \* \* \* \*